United States Patent [19]
Berg et al.

[11] 4,080,647
[45] Mar. 21, 1978

[54] ELECTRIC VOLTAGE MULTIPLIER ASSEMBLY

[75] Inventors: Ludwig Berg; Ferdinand Utner, both of Regensburg, Germany

[73] Assignee: Siemens Aktiengesellschaft, Berlin & Munich, Germany

[21] Appl. No.: 705,566

[22] Filed: Jul. 15, 1976

[30] Foreign Application Priority Data

Jul. 28, 1975 Germany .............................. 2533720

[51] Int. Cl.² ............................................. H02M 7/00
[52] U.S. Cl. ..................................... 363/59; 307/110
[58] Field of Search .................... 321/15; 307/110; 29/624; 363/59, 60

[56] References Cited

U.S. PATENT DOCUMENTS

| 3,589,003 | 6/1971 | Kastner | 321/15 |
| 3,902,108 | 8/1975 | Sion | 321/15 |
| 4,010,535 | 3/1977 | Hishiki et al. | 321/15 |

FOREIGN PATENT DOCUMENTS

| 2,350,964 | 10/1973 | Germany | 307/110 |
| 2,314,674 | 3/1973 | Germany | 321/15 |
| 1,368,226 | 9/1974 | United Kingdom | 321/15 |

Primary Examiner—William M. Shoop
Attorney, Agent, or Firm—Hill, Gross, Simpson, Van Santen, Steadman, Chiara & Simpson

[57] ABSTRACT

A voltage multiplier cascade assembly contains diodes and two capacitor blocks. The capacitor blocks are severed from a mother capacitor and subdivided by way of slots through the Schoop layers and the capacitance-effective areas of the capacitor to form a row of intergrally interconnected layer capacitors having several contact surfaces. The diodes are placed between the capacitor blocks to improve heat disipation and enhance the screening of interference radiation from the diodes. Connections are affected by a metal mounting lattice having terminal plates and contact strips. The entire assembly is cast in a cup and preferably serves for use in television apparatus.

7 Claims, 4 Drawing Figures

U.S. Patent    March 21, 1978    4,080,647
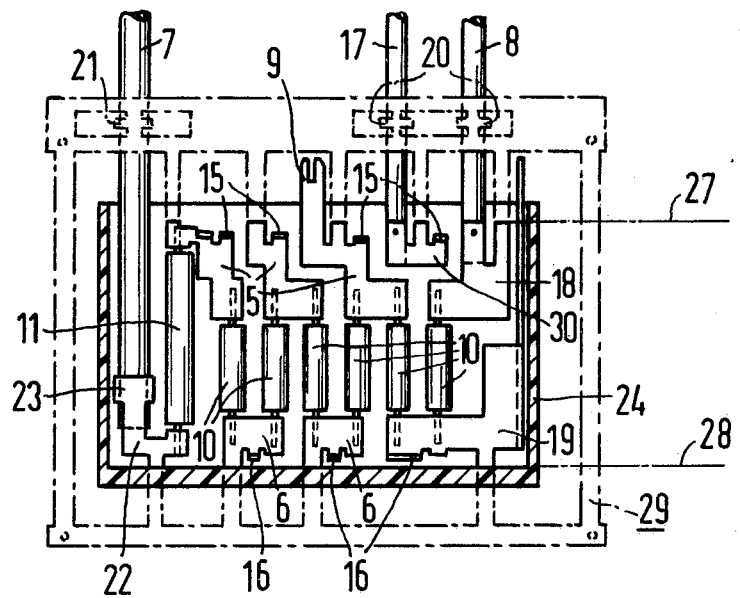

ELECTRIC VOLTAGE MULTIPLIER ASSEMBLY

BACKGROUND OF THE INVENTION

1. Field of the Invention

This invention relates to an electric voltage multiplier cascade and more particularly to a voltage multiplier cascade utilizing capacitors subdivided by slots through Schoop layers.

2. Description of the Prior Art

It is known from U.S. Pat. No. 3,900,708 (German Patent application DT-OS 2,314,674) to provide a voltage multiplier cascade utilizing slotted capacitors through Schoop layers and capacitance-effective portions of the capacitor. Such capacitor blocks form a roll of integrally interconnected layer capacitors which are subdivided at the Schoop layers into several contact surfaces which connect with diodes and further electric components in the multiplier cascade assembly.

As shown in FIG. 1A which is similar to FIG. 3 in U.S. Pat. No. 3,900,708, a capacitor block 31 has slots 32 cut through the end contact or Schoop layers and also into the capacitance-effective areas of the capacitor. Contact surfaces 33 result on the capacitor block 31 to which diodes 34 may be connected.

As shown in the prior art illustrated by FIG. 1A, the diodes 34 are arranged parallel to the surface of the capacitor and between Schoop layers forming contact surfaces. These diodes 34 are electrically connected with corresponding contact surfaces at ends of the capacitor block 31. The capacitor block 31 comprises all capacitors of the multiplier cascade.

This arrangement does not permit sufficient heat dissipation from the diodes. Thus, the diodes may not carry heave currents. Furthermore, production of these cascade assemblies requires a relatively expensive adjustment or placement of the individual diodes upon the capacitor blocks for the purpose of welding some terminal wires of the diodes to the Schoop layers.

SUMMARY OF THE INVENTION

It is an object of the present invention to improve the heat dissipation from the diodes, to lower interference radiation outside of the cascade assembly, and to simplify production of the cascade assembly by use of a design which is well adapted for automation.

This object is accomplished according to the invention by welding or soldering diodes onto terminal plates of a mounting lattice wherein these terminal plates are integrally connected with contact strips. The contact strips are guided over contact surfaces of capacitor blocks and welded or soldered thereto. The diodes are arranged between capacitor blocks and parallel to surfaces of the blocks.

With such a construction, the terminal plates and contact strips can be integrally formed from a mounting tape or ribbon. The diodes and other electronic component elements may be automatically applied to the mounting tape and welded or soldered to the appropriate terminal plates. In addition, with the construction of this invention, cooling of the diodes is greatly improved even though they are located at inner portions of the cascade. This results since the heat produced within the very small area of the diodes is quickly distributed over the entire volume of the cascade so that the entire cascade is available for dissipating the heat to the air. Furthermore, since the cascade is cast within a cup, the casting removes heat much better than the air. Furthermore, diodes are also screened by the two capacitor blocks on either side of the diodes so that interference radiation from the diodes is reduced outside of the cascade assembly.

The position of the component elements in the cup is fixed by casting the cascade after insertion into the cup. Also, at least a portion of the terminal plates are integrally connected with mounting elements protruding beyond the capacitor blocks. These mounting elements are mechanically and firmly connected to the cup by use of matching mounting elements. Therefore, any floating of the component elements during the casting process is avoided and an ideal position for the component element with respect to one another is guaranteed.

Production of the assembly can be automated to the greatest extent possible when a series dropping resistance is inserted along with the diodes in parallel fashion into the cascade.

In an embodiment of this invention which is particularly suited for automation, the cup is comprised of plastic at its inner walls. Also, plastic ribs are mechanically and rigidly connected to a bottom of the cup. These ribs prevent lateral shifting of the layer capacitor blocks. The contact surfaces of the capacitor blocks and the contact strips connected thereto are all arranged at upper sides of the capacitors. The contact strips are angled off and a portion of their length extends between the two capacitor blocks. These contact strips are positioned parallel to one another in the area between the capacitor blocks and parallel to the capacitor contact surfaces. Terminal plates integrally connect with the contact strips and terminal elements for other terminals extend upwardly out of the cup through the casting. Such a design prevents floating of the assembly during casting in the cup since close to the opening sawtooth-shaped protrusions are provided. These protrusions, which are preferably located on at least two sides of the cup, have a surface which is inclined with respect to the cup wall and another surface approximately perpendicular to the cup wall. Since the inclined surface points towards the cup opening, spring mounting elements on the cascade abut the sawtooth protrusions to maintain the assembly within the cup. Another convenient mounting configuration occurs when the frontal surfaces of one capacitor block are positioned upwardly in the cup while the contact surfaces of the other capacitor block are positioned down in the cup. This embodiment permits fairly large areas of casting in cup plastic between the different terminal plates or contact strips with respect to the device casing. Such an arrangement is able to withstand higher voltage differentials.

A preferred method for the production of voltage multiplier cascades in accordance with this invention includes the step of first punching and shaping terminal plates and contact strips from a metal tape to create a mounting lattice which remains integrally connected with the metal tape. The mounting lattice obtained in this way is automatically welded with diodes and possibly other component elements. The contact strips are welded onto corresponding contact surfaces of the capacitor blocks and then the mounting lattice is severed. In this manner, all components are held in the desired positions until final assembly.

BRIEF DESCRIPTION OF THE DRAWINGS

FIG. 1A is a perspective view of a prior art voltage multiplier cascade assembly;

FIG. 1 is a cross-sectional view illustrating the position of capacitor blocks and diodes with respect to one another in the cup;

FIG. 2 illustrates a mounting strip or lattice represented by dashed lines and without the presence of capacitor blocks and wherein the parts which finally remain in the cascade assembly are shown as continuous lines; and FIG. 3 illustrates another embodiment of the invention whereby the position of the capacitor blocks and diodes in a cup is illustrated.

DESCRIPTION OF THE PREFERRED EMBODIMENTS

In FIG. 1, two capacitor blocks 1 and 2 formed from a mother capacitor and of similar layer construction are placed into a cup 24 whereby the capacitor block 1 has an upper contact surface 3 and the capacitor block 2 a lower contact surface 4. Diodes 10 are arranged between the capacitor blocks 1, 2. These diodes connect through contact surfaces 3 and 4 via terminal plates 5, 6 and contact strips 15, 16 which are integrally connected with the corresponding terminal plates. The connection of the terminals of diodes 10 with the terminal plates 5, 6 and the connection of the contact strips 15, 16 with the contact surfaces 3, 4 of the capacitor blocks is produced by welding or soldering. The capacitor blocks 1 and 2 are maintained in position at the cup bottom by use of plastic ribs 26 which prevent lateral shifting. Also, terminal cables and individual diodes may be fixed in position by plastic ribs, not shown.

As seen in FIG. 2, the diodes are arranged parallel to one another and parallel to a resistance 11. Resistance 11 is utilized as a dropping resistance and connects with the high voltage cable 7 via terminal plate 22. A clamp 23 integrally connected with terminal plate 22 retains the high voltage cable 7 during mounting. The cable 7 provides the high voltage from the circuit. The input voltage is supplied to terminal plates 18 or 30, respectively, via high voltage lines 8 or 17. Furthermore, the first diode of the cascade is connected with terminal plate 18 and the terminal plate 30 contacts the first capacitor via a contact strip 15.

High voltage line 7, which is particularly critical with respect to high voltage insulation, is aligned to the bottom of the cup and there connected with terminal plate 22. Thus, a mechanically stable connection between the casting within the cup and the insulation of the high voltage cable is produced. This prevents voltage breakthrough which may result from tiny tears and gaps between the cable insulation and the casting. This arrangement of the cable 7 is particularly advantageous since there is no need to form the high voltage cable as a loop as would be the case if the connecting terminal were positioned in an upper portion of the cup.

The mounting lattice 29 is illustrated with dotted line since it is severed along separation lines 27 and 28 during insertion of the circuit into the cup 24. The lattice 29 preferably consists of tin coated iron sheet metal. This mounting lattice 29 also contains mounting clamps 20 and 21 which retain high voltage cables 7, 8 and 17 in their final positions during fitting of the mounting lattice. They also prevent impermissible bending of the cables in the area later to be cast. After separation of the mounting lattice along separation lines 27 and 28, which preferably occurs during a punching process, clamps 20 and 21 are removed from high voltage cables, 7, 8 and 17. Outer terminals 9 are integrally connected with corresponding terminal plates 5 or 19. These terminals may also consist of U-shaped bent wires which are welded onto terminal plates 5 or 19. In the latter case, the mounting lattice 29 may be severed by a cutting process since the terminal plates 5 must not protrude beyond the cutting line 28 when the other terminals 9 are welded on after the separation process. In this case, solder lugs formed by the bent wires must not be subsequently tin coated as in the case of solder lugs punched from previously tin coated sheet metal.

FIG. 3 illustrates another embodiment in accordance with the invention. In this embodiment, capacitor blocks 1 and 2 are arranged in the cup in such a way that contact surfaces 3 and 4 are both on top. Diodes 10 are again arranged between capacitor blocks 1 and 2. Contact strips 12 and 13 are integrally connected with terminal plates 5 or 14, respectively. Contact strips 12 and 13 are guided downwardly adjacent to corresponding diodes 10 and parallel thereto. Contact strips 12 and 13 also protrude beyond the contact surfaces 3 and 4 and into contact with the cup wall to form mounting elements 31. These mounting elements are then fixed in position by protrusions 25. Thus, floating of the component elements during casting is prevented. During the insertion of the capacitors, the entire length of contact strips 12 and 13 and the terminal plates 5 and 14 function as a spring so that the arrangement can be pressed into the beaker without difficulty and whereby the mounting element portions 31 of the contact strips 12 and 13 snap behind the protrusions 25. Ribs 26 at the bottom of the cup 24 fix the lateral position of the capacitor blocks. Terminal plate 14 does not touch the bottom of the cup 24.

Connection of the component elements with the mounting lattice may also be accomplished by a "reflow" soldering technique such that the mounting tape is tinned before the fitting process. After the fitting process, the lattice is heated near the terminal wires of the component elements such that the solder melts and the terminal wires become electrically connected. Recesses may be embedded in the terminal plates to obtain adequate wetting of the terminal wires. Heating of the terminal plates after the fitting process may be effected by use of small flames, solder brackets, various types of radiators, inductors or other similar heat producing items.

The assembly of this invention and particularly the use of contact strips is advantageous when compared with direct soldering of terminal wires since the contact strips may be guided onto the center of the respective frontal contact surfaces of the capacitors to prevent solder bead formation at the slots of the capacitor blocks. Furthermore, the contact strips are easily accessible for welding electrodes. Tolerance requirements for adjustment of the components during welding is minor since the contact surfaces of the strips are large as compared with the use of terminal wires only. Also, the placement of the diodes between the capacitor blocks guarantees a space saving design for the cascade which is reflected in the design of the cross-section for the cup. Such a design results in significant economic benefits.

Although various minor modifications may be suggested by those versed in the art, it should be understood that I wish to embody within the scope of the patent warranted hereon, all such embodiments as reasonably and properly come within the scope of my contribution of the art.

I claim as my invention:

1. An electric voltage multiplier cascade comprising:
   a) two end-contacted capacitor blocks of substantially the same layer construction, each capacitor block being subdivided with slots through Schoop layers and the capacitance - effective portions of the capacitor blocks to form a row of integrally interconnected layer capacitors with a plurality of contact surfaces;
   b) diodes arranged between said two capacitor blocks and parallel to surfaces of the capacitor blocks;
   c) terminal plates electrically connected to the diodes, said plates interconnecting the diodes as a wiring; and
   d) contact strips integrally connected with said terminal plates, said strips being arranged over said capacitor block end-contact surfaces and electrically connected thereto.

2. The electric voltage multiplier cascade in accordance with claim 1 in which the cascade is cast within a cup and at least some of the terminal plates integrally connect with mounting elements protruding beyond the capacitor blocks toward sidewalls of the cup and in which the mounting elements are mechanically and rigidly in contact with the cup.

3. The electric voltage multiplier cascade in accordance with claim 1, characterized in that a series dropping resistance is positioned parallel to the diodes, and that all diodes are positioned parallel to one another.

4. The electric voltage multiplier cascade in accordance with claim 1, characterized in that the cascade is cast in a cup, the cup consisting of plastic at least in the areas of its inner wall, that plastic ribs are mechanically rigidly connected with the cup bottom, and that these ribs abut with the capacitor blocks to prevent a lateral shifting of the capacitor blocks, that the contact surfaces of the capacitor blocks and the connected contact strips are all located at the upper sides of the capacitor blocks, that the contact strips are angled with respect to said terminal plates and a part of their length extends between the two capacitor blocks, that the contact strips are positioned parallel to one another and to the capacitor surfaces in the area between the capacitor blocks and are integrally connected with the terminal plates below, and that a terminal element connected to at least one of the terminal plates for an outer terminal extends upwardly out of the cup through casting in the cup.

5. The electric voltage multiplier cascade in accordance with claim 2, characterized in that the cup has sawtooth-shaped protrusions provided on at least two sides near an opening on the inside of the cup, said protrusions having a surface inclined with respect to the cup wall and a surface which is at least approximately perpendicular to the cup wall, that the mounting elements are spring-like, and that they are held in the cup by the sawtooth-shaped protrusions.

6. The electric voltage multiplier cascade in accordance with claim 1, characterized in that the cascade is cast in a cup and frontal contact surfaces on one of the capacitor blocks are positioned upwardly in the cup, while frontal contact surfaces of the other capacitor blocks are positioned down in the cup.

7. An electric voltage multiplier cascade assembly comprising:
   a) two end contacted capacitor blocks, each capacitor block being subdivided with slots which split capacitor layers to form serially connected capacitors, said slots forming a plurality of contact surfaces at one end of each capacitor block;
   b) diodes arranged between said two capacitor blocks and parallel to surfaces of the capacitor blocks;
   c) a mounting lattice having terminal plates electrically connected to the diodes, some of said terminal plates commonly connecting ends of two diodes in series;
   d) contact strips which are part of said mounting lattice connecting with said terminal plates, said strips being arranged over said capacitor block contact surfaces and electrically connected thereto; and
   e) a cup with an interior casting containing said capacitor blocks, diodes and mounting lattice;
   whereby the assembly permits heat dissipation from the diodes, shields the diodes to prevent radiation, and is adapted for mass production.

* * * * *